United States Patent
Vogelsang et al.

[11] Patent Number: 6,067,261
[45] Date of Patent: May 23, 2000

[54] TIMING OF WORDLINE ACTIVATION FOR DC BURN-IN OF A DRAM WITH THE SELF-REFRESH

[75] Inventors: Thomas Vogelsang, Williston; Adam B. Wilson, South Burlington, both of Vt.

[73] Assignees: International Business Machines Corporation, Armonk, N.Y.; Infineon Technologies North America Corp., San Jose, Calif.

[21] Appl. No.: 09/127,740

[22] Filed: Aug. 3, 1998

[51] Int. Cl.[7] .................................................. G11C 7/00
[52] U.S. Cl. .......................................... 365/201; 365/222
[58] Field of Search ................................ 365/201, 222, 365/230.06

[56] References Cited

U.S. PATENT DOCUMENTS

| | | | |
|---|---|---|---|
| 5,276,649 | 1/1994 | Hoshita et al. | 365/206 |
| 5,416,742 | 5/1995 | Takada | 365/203 |
| 5,495,448 | 2/1996 | Sachdev | 365/201 |
| 5,615,164 | 3/1997 | Kirihata | 365/230.06 |
| 5,661,690 | 8/1997 | Roohparvar | 365/201 |
| 5,862,094 | 1/1999 | Kawabata et al. | 365/201 |
| 5,956,281 | 9/1999 | Nakai et al. | 365/201 |
| 5,991,214 | 11/1999 | Merritt et al. | 365/201 |

OTHER PUBLICATIONS

IBM Technical Disclosure Bulletin, vol. 30, No. 10 Mar. 1988, "Staggered Block Write In A Storage Array", p. 289.

*Primary Examiner*—Son T. Dinh
*Attorney, Agent, or Firm*—Daryl K. Neff, Esq.; McGinn & Gibb, P.C.

[57] ABSTRACT

A method of testing a semiconductor circuit, the semiconductor circuit including word lines connected to a storage device, address receivers receiving addresses, an address decoder decoding the addresses and selecting ones of the word lines, a self-refresh unit refreshing the word lines during a non-test mode and a test mode device controlling the semiconductor circuit in a test mode, the method comprises supplying a test mode signal to the test mode device, activating a test mode operation of the self-refresh unit, sequentially activating the word lines using the self-refresh unit, maintaining the word lines in an active condition for a predetermined time period and deactivating the word lines.

8 Claims, 3 Drawing Sheets

TIMING OF WORDLINE ACTIVATION FOR DC BURN-IN OF A DRAM WITH THE SELF-REFRESH

BACKGROUND OF THE INVENTION

1. Field of the Invention
2. Description of the Related Art

The present invention generally relates to DC burn-in that is used to keep the wordlines at a very high voltage over a period of about 10s so as to place maximum stress on an isolation between wordlines and cells or bitlines.

This maximum stress condition is used in place of normal operations (e.g., individual reading and writing) through each wordline to reduce the testing time. A normal operating condition cannot be realistically used to test a circuit since the testing time would be excessive. For example, for 2 k over 5 hours of testing time would be necessary to individually hold every word line high for 10s using normal operating conditions.

Therefore, conventionally all wordlines are simultaneously activated at the same time to produce the maximum stress and reduce the time duration of burn-in. However, switching all lines on at the same time leads to a huge voltage drop in the wordline power network (Vpp net). More specifically, turning all the wordlines on at once induces a huge current spike on the wordline power supply and can lead to a voltage drop in the power net and to reliability problems at the power lines. More specifically, if an external voltage supply Vpp is used to power the conventional burn-in, the resistance of the on-chip wiring from the external pad to the internal Vpp net limits the current. Therefore, the wire from the pad to the Vpp net will see significant electro-migration stress and might even fuse.

An exemplary conventional circuit is illustrated in FIG. 1. The conventional circuit includes address receivers 10 which receive addresses 15, control signal receiver 14, a test mode decoder 11, a word decode system 12 supplied with a wordline power network voltage 17 (Vpp) and a memory array 13 which receives a DC burn-in signal 16 from the test mode decoder 11.

FIG. 2 illustrates the timing of the signals within the circuit shown in FIG. 1. More specifically, FIG. 2 illustrates the row address strobe signal (RAS), column address strobe signal (CAS), write enable signal (WE), address signal (ADR—which can be any of addresses $XA_o \ldots XA_n$), word line signals (WL0, WL ... $WL_x$ and wordline power network voltage signal. (Vpp)

As shown in FIG. 2, the DC burn-in signal causes all the word lines (WL0, WL ... $WL_x$) to simultaneously go high, which causes a current spike and a substantial drop (e.g., greater than 2 V) on the wordline power network voltage signal Vpp. As mentioned above, this current spike on the wordline power supply can lead to reliability problems at the power lines.

SUMMARY OF THE INVENTION

It is, therefore, an object of the present invention to provide a structure and method for DC burn-in used to stress all wordlines in a DRAM using the circuit's existing self-refresh oscillator to maximize stress on the wordlines (without causing a substantial drop on the wordline power network voltage signal Vpp), while keeping the test time as short as possible.

More specifically, the invention includes a method of testing a semiconductor circuit, the semiconductor circuit including word lines connected to a storage device, address receivers receiving addresses, an address decoder decoding the addresses and selecting ones of the word lines, a self-refresh unit refreshing the word lines during a non-test mode and a test mode device controlling the semiconductor circuit in a test mode, the method comprising supplying a test mode signal to the test mode device, activating a test mode operation of the self-refresh unit, sequentially activating the word lines using the self-refresh unit, maintaining the word lines in an active condition for a predetermined time period and deactivating the word lines.

The self-refresh unit sequentially activates and deactivates the word lines during the non-test mode, the step of sequentially activating the word lines including a step of modifying an operation of the self-refresh unit to sequentially activate the word lines and maintain the word lines in an active state.

The circuit further includes a multiplexor connected to the address decoders, the method further comprising a step of disconnecting the receivers from the word lines during the test mode using the multiplexor. The circuit further includes a test mode decoder, the step of supplying a test mode signal to the circuit comprising supplying a test mode signal to the test mode decoder, the method further comprising a step of activating a test mode of the self-refresh unit when the test mode decoder receives the test mode signal.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

As mentioned above, turning on all wordlines at the same time induces a huge current spike on the wordline power supply and can lead to a voltage drop in the power net and to reliability problems at the power lines. The invention uses the circuit's existing self-refresh oscillator to sequentially turn on all wordlines (as during a normal self refresh operation) which only minimally increases the time required (e.g., typically a 64 ms to 512 ms increase) to turn on all wordlines for the required retention time.

The required retention time for DC burn-in is on the order of 10s, so the 64 ms to 512 ms increase does not increase test time significantly. Further, the load on the power supply will be similar to a normal refresh operation and will not result in the undesirable current spike, discussed above.

Figure 3:
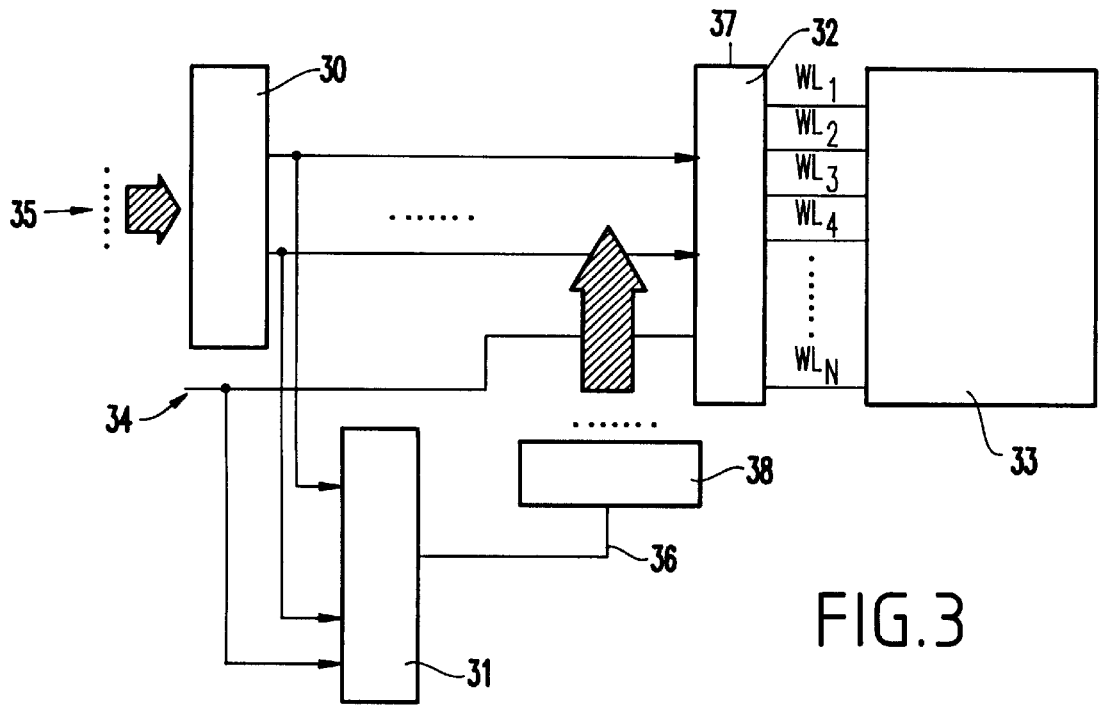
FIG. 3 is a schematic diagram of circuit according to the invention.

Referring now to the drawings, and more particularly to FIG. 3, the inventive circuit includes address receivers 30 which receive addresses 35, control signal receiver 34, a test mode decoder 31, a word decode system 32 supplied with a wordline power network voltage 37 (Vpp), a memory array 33 and a self-refresh counter 38 which receives a DC burn-in signal from the test mode decoder 31.

Many of the structures used with the invention are conventionally well known by those ordinarily skilled in the art and a detailed discussion of such structures is omitted from this disclosure for brevity and in order that the novel features of the invention are made clear. Therefore, at many points in this disclosure certain components and/or systems are referred to as "off the shelf" components/systems.

The address receivers 30, which can be "off the shelf receivers", buffer the incoming address 35 from an external memory controller (not illustrated). The address receivers 30 transfer the incoming address 35 to the memory chips internal address buses. These addresses are used in decoding the memory array 33 during normal (e.g., read, write and refresh) operations.

The control signal receivers 34, which can be, but, are not limited to "off the shelf receivers", receive the incoming control command. The control commands can include, but are not limited to a) read b) write and c) testmode (TM).

The testmode decoder 31 is preferably a decoder which compares the incoming address to known sets of predetermined testmode addresses. The testmodes enable the memory chip to function outside the normal operating parameters, usually by means of an on chip control signal that enables some other function. Examples of testmodes include a) signal margin test b) cas before ras refresh (CBR) c) voltage regulation disable d) DC wafer burn-in and many others.

The self-refresh counter 38, when enabled, performs a refresh operation of specific duration. The self-refresh counter 38 is preferably an "off the shelf system".

The word decode system 32 can also preferably be an "off the shelf system" and can be powered from either an externally supplied voltage or a voltage that is internally generated (this voltage is referenced above as Vpp). The generation of Vpp again can be accomplished with "off the shelf circuits".

During a normal self-refresh operation, the self-refresh counter 38 creates a row address, activates the row, waits until all cells on the row are refreshed, deactivates the row and increments the row address. These steps are repeated such that all cells are refreshed within a predetermined time (which is substantially less than a conventionally required burn-is time). For example, a refresh operation of 4 k with a 15μs interval between subsequent wordline activations requires a total of 64ms. Similarly a refresh operation on 32 k would require 512ms. The additional time of 64ms to 512ms added to the conventional burn-in time of about 10s does not increase the test time significantly.

Contrary to a normal self-refresh operation, with the invention the previous wordline is not deactivated before the next wordline is activated, during the DC burn-in mode. Therefore, with the invention, all wordlines are sequentially set to a high state (e.g., sequentially turned on). Then, as with conventional burn-in operations, once all wordlines are turned on, the wordlines are held in a high state for a customary, period (e.g., 10s) to allow sufficient stress to be placed on the wordlines such that defective devices may be detected.

Figure 1:
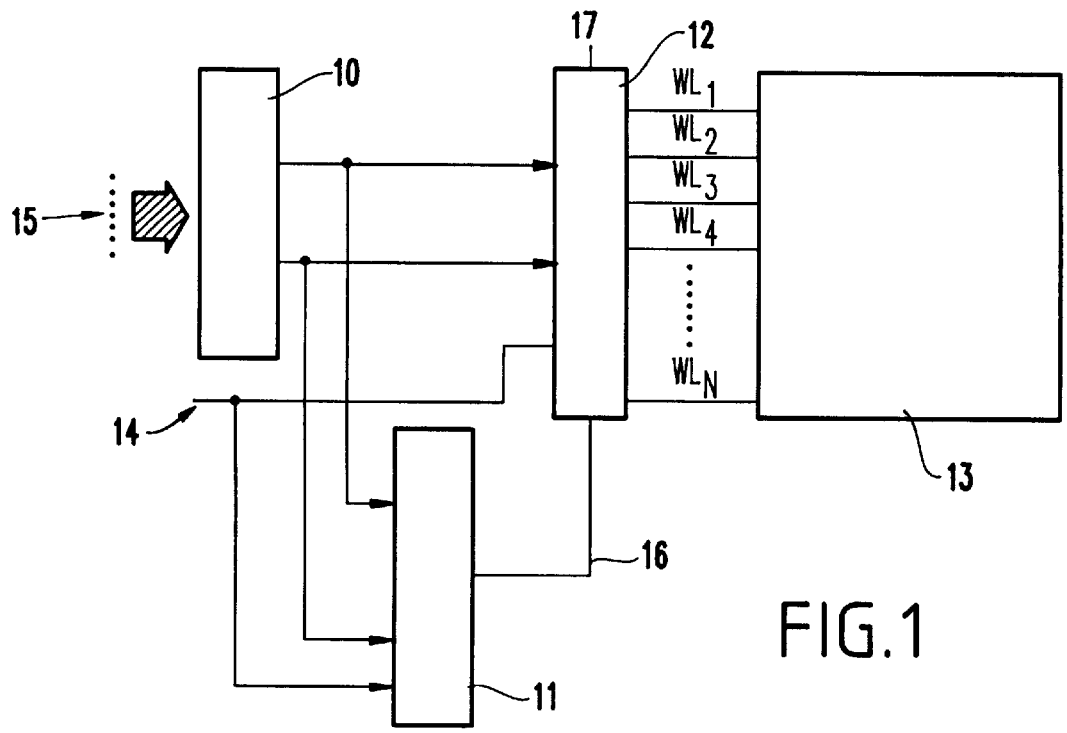
FIG. 1 is a schematic diagram of conventional circuit.
Figure 2:
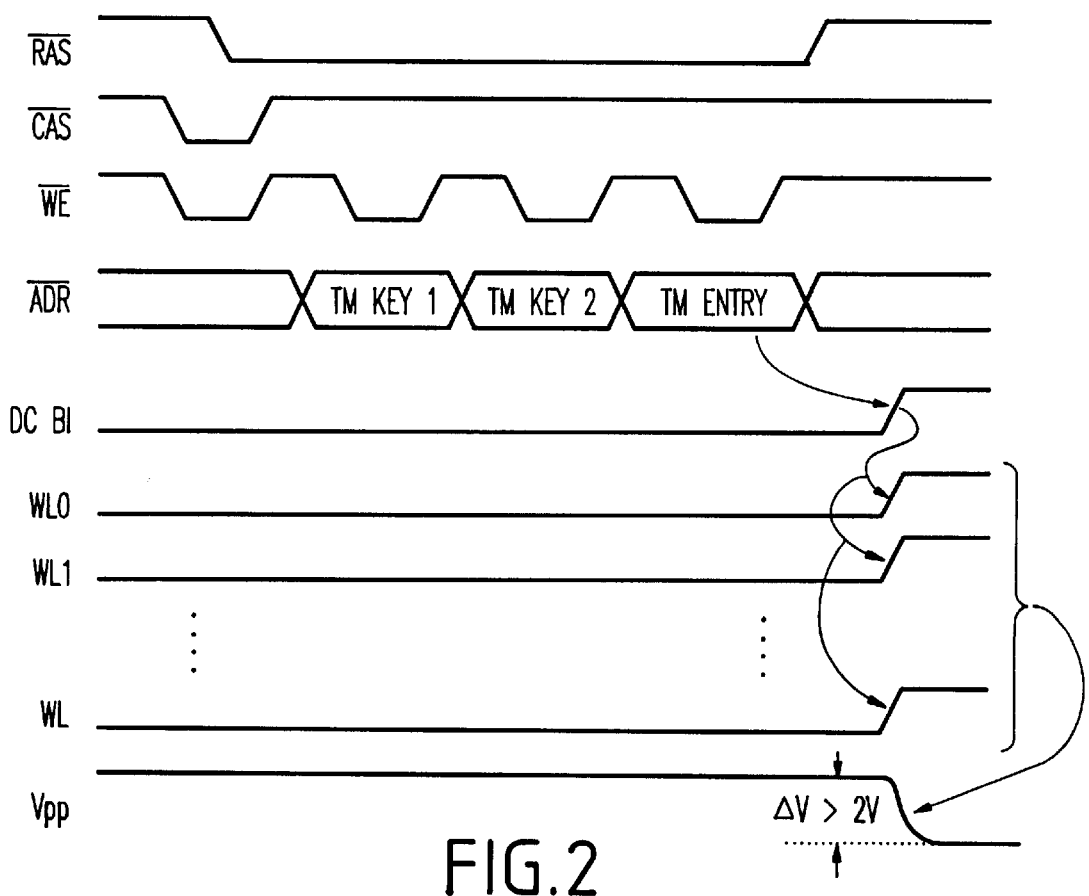
FIG. 2 is a timing diagram illustrating the states of various signals within the circuit shown in FIG. 1 at different times.
Figure 4:
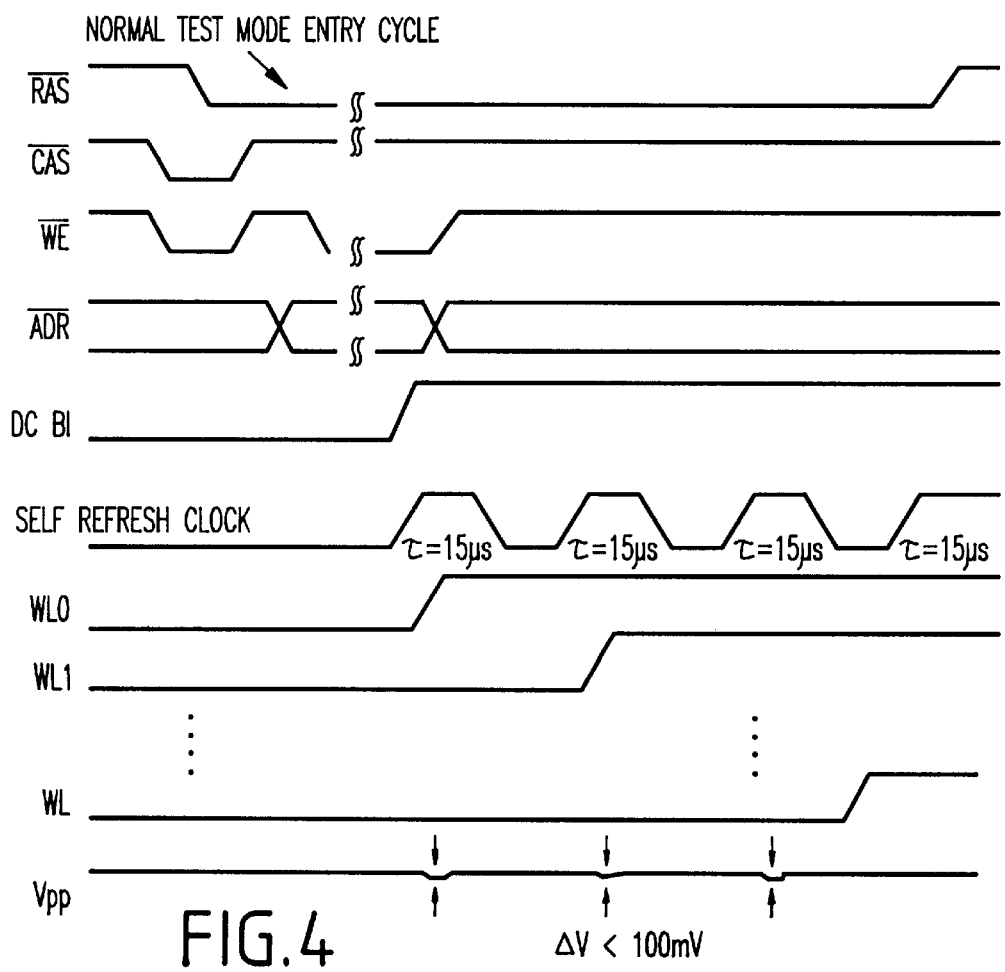
FIG. 4 is a timing diagram illustrating the states of various signals within the circuit shown in FIG. 3 at different times.

FIG. 4 illustrates the timing of the signals within the circuit shown in FIG. 3. As with the signals shown in FIG. 2, FIG. 3 illustrates the row address strobe (RAS) signal, column address strobe signal (CAS), write enable signal (WE), address signal (ADR—which can be any of addresses $XA_0 \ldots XA_n$), word line signals (WL0,WL. . . $WL_x$) and wordline power network voltage signal (Vpp).

However, unlike the situation shown in FIG. 2, the activation of the wordlines (WL0, WL. . . $WL_x$) in FIG. 4 is sequential. Each of the wordline signals (WL0, WL. . . $WL_x$) is activated at its own unique point in time such that the voltage drop of the voltage signal Vpp shown in FIG. 2 does not occur in FIG. 4. Instead, only minor insignificant variations occur along the voltage signal Vpp in areas shown by the opposing arrows in FIG. 4.

Figure 5:
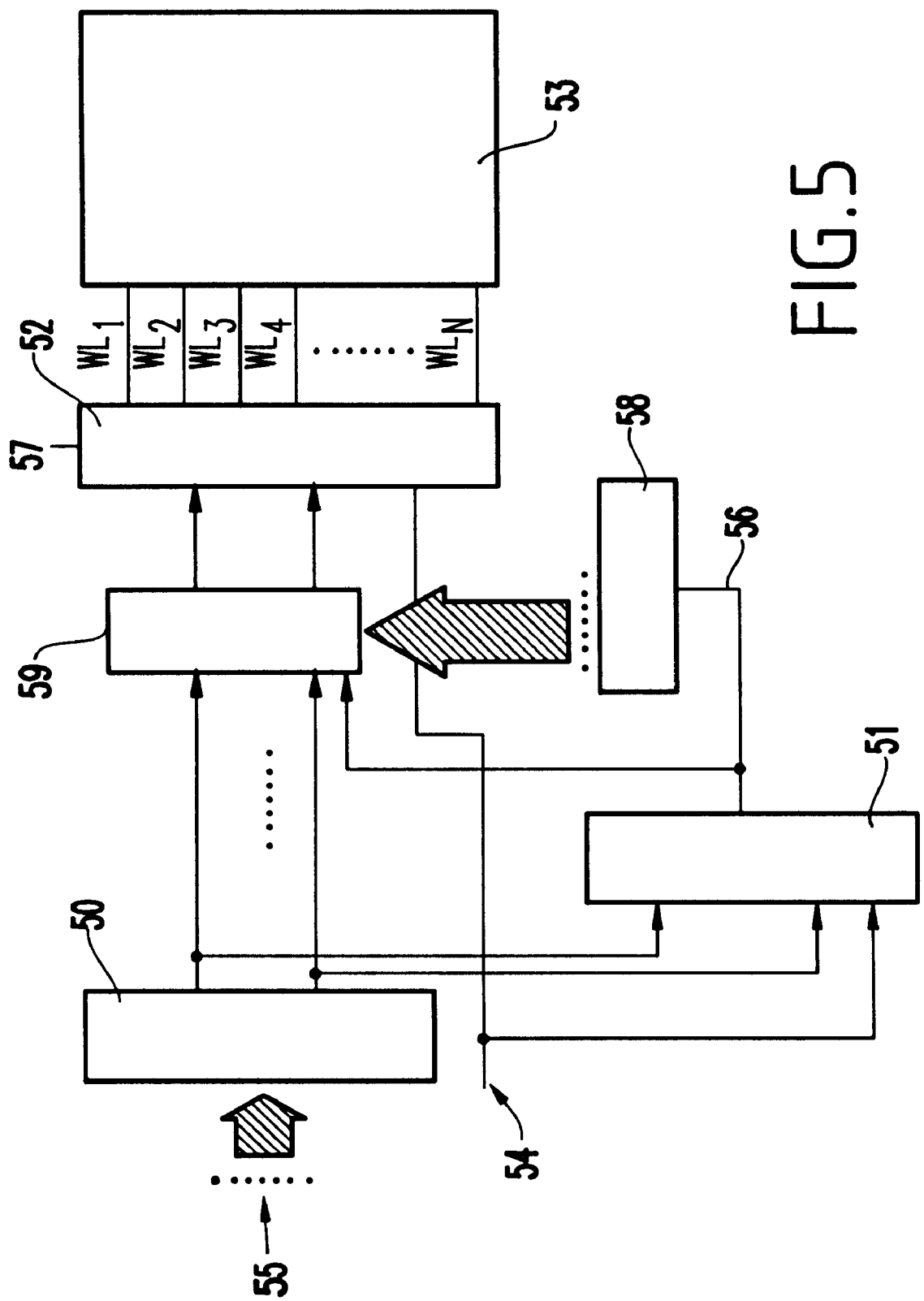
FIG. 5 is a schematic diagram of circuit according to the invention.

In another embodiment of the invention, FIG. 5 illustrates a similar structure shown in FIG. 3, except for the inclusion of the multiplexor 59. More specifically, FIG. 5 illustrates a circuit that includes address receivers 50 which receive addresses 55, a control signal receiver 54, a test mode decoder 51, a word decode system 52 supplied with a wordline power network voltage 57 (Vpp), a memory array 53 and a self-refresh counter 58 which receives a DC burn-in signal 56 from the test mode decoder 51.

This system shown in FIG. 5 decodes a wordline whose address 55 is presented to the address receivers 50. During DC burn-in, the appropriate address/control combination is presented to the chip so that the DC burn-in testmode is entered. This activates the DC burn-in signal (DC BI) 56 from testmode decoder 51. The DC burn-in signal 56 causes the multiplexor 59 to pass addresses from the self-refresh system 58 to the address bus while addresses 55 from the address receivers 50 are ignored. The multiplexor allows the flexible placement of the self-refresh control circuit block. Implementation of the embodiment shown in FIG. 3 requires that the address receivers be disabled after entering the burn-in test mode. Without the multiplexor, additional logic control would be required to disable the address receivers 50. By inserting the multiplexor 59, no other control of the address receivers 50 is needed.

The multiplexor 59 is "off the shelf" and preferably comprises, as would be known to one ordinarily skilled in the art given this disclosure, full CMOS pass gates whose controls are the inverse of each other.

The following logical operations are performed to implement the inventive DC burn-in process. A DC burn-in (BURNINDC IPL) code is supplied to the self-refresh control circuits 54 with row address 0 as a start value. The DC burn-in (BURNINDC) signal inhibits row deactivation and sets all other array functions in the same way as in the conventional DC burn-in mode.

The DC burn-in signal can be used to shut off the self-refresh control circuits 54 when the highest row address in the self-refresh counter is reached. If the activation of an already active row does not present a conflict, or if it is necessary to keep the wordline high for the long burn-in time, such shut-off is preferably not be used.

The DC burn-in signal, together with the IPL clear signal, switch off all wordlines. Further, the invention minimizes the impact on the ground net, as discussed above.

In another embodiment of the invention, the DC burn-in count preferably includes only the even or only the odd row addresses in DC burn-in mode to induce WL-WL stress. As would be known by one ordinarily skilled in the art given this disclosure, the odd or even row addresses can be individually selected by clamping the low row address bit after the self-refresh counter if, for example, DC burn-in is enabled.

The current needed to switch on all wordlines in the DC burn-in mode is substantially similar to that required in the normal refresh mode. The current will be limited by the maximum current of the internal Vpp generator, the resistance in the Vpp net or the resistance of the line from a Vpp force pad to the internal Vpp net, as would be known to one ordinarily skilled in the art given this disclosure.

The Vpp system is designed to provide, with some margin, the current requirements during normal wordline activation. Trying to design the Vpp system to handle 2 k to 8 k the normal current would not be practical. The ration of $$\frac{C_{vpp}}{C_{wl}} \ll 1$$

indicates the negative effect of conventionally simultaneously selecting all the wordlines on the Vpp. The amount of charge required to simultaneously select all wordlines is much more than what is stored on Vpp capacitance. This conventionally results in a large voltage drop on Vpp. The bandwidth of the Vpp system is small and will not compensate for this conventional large voltage drop. If the ratio was much greater than 1, the effect of the voltage drop would be minimized. However, making the Vpp system larger requires more chip area, which is impractical. The ability to powerup Vpp within the specification time is also an advantage the invention produces. The initial voltage drop in the Vpp net will therefore be determined by the ratio of the Vpp buffer capacitance to the wordline capacitance, which is significantly smaller than 1.

As mentioned above, using the self refresh oscillator to sequentially turn on the wordlines reduces the load on the Vpp net to the normal refresh operation value. Further, the additional chip area needed is minimal, since the oscillator is already supplied to the chip to perform refresh operations and is already connected to the circuits that turn on the word lines. Further, as mentioned above, the additional time of 64ms to 512ms added to the stress time of about 10s will not increase the test time significantly.

Other benefits of the invention include a well controlled and defined Vpp voltage. With conventional methods, variations in Vpp were large and hard to determine. By adding only minimal circuits to existing circuits, no appreciable chip area is required. Further, on chip power supply bussing (Vpp) does not impact the invention. While other methods require adding a power supply to the burn-in chamber, the invention does not need an additional power supply, which helps reduce burn-in costs. Also by using on chip circuits to initiate burn-in, burn-in test complexity is reduced.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of testing a circuit, said circuit including lines and a self-refresh unit refreshing said lines during a non-test mode, said method comprising:

supplying a test mode signal to said circuit;

sequentially activating said lines using said self-refresh unit;

maintaining said lines in an active condition for a predetermined time period; and deactivating said lines.

2. The method in claim 1, wherein said self-refresh unit sequentially activates and deactivates said lines during said non-test mode, said step of sequentially activating said lines including a step of modifying an operation of said self-refresh unit to sequentially activate said lines and maintain said lines in an active state.

3. The method in claim 1, wherein said circuit further includes address decoders connected to said lines and a multiplexor connected to said address receivers, said method further comprising a step of disconnecting said address receivers from said lines during said test mode using said multiplexor.

4. The method in claim 1, wherein said circuit further includes a test mode decoder, said step of supplying a test mode signal to said circuit comprising supplying said test mode signal to said test mode decoder, said method further comprising a step of activating a test mode of said self-refresh unit when said test mode decoder receives said test mode signal.

5. The method in claim 1, where said lines comprise word lines, said step of sequentially activating said lines comprising a step of sequentially activating said word lines.

6. A method of testing a semiconductor circuit, said semiconductor circuit including word lines connected to a storage device, address receivers receiving addresses, an address decoder decoding said addresses and selecting ones of said word lines, a self-refresh unit refreshing said word lines during a non-test mode and a test mode device controlling said semiconductor circuit during a test mode, said method comprising:

supplying a test mode signal to said test mode device;

activating a test mode operation of said self-refresh unit;

sequentially activating said word lines using said self-refresh unit;

maintaining said word lines in an active condition for a predetermined time period; and deactivating said word lines.

7. The method in claim 6, wherein said self-refresh unit sequentially activates and deactivates said word lines during said non-test mode, said step of sequentially activating said word lines including a step of modifying an operation of said self-refresh unit to sequentially activate said word lines and maintain said word lines in an active state.

8. The method in claim 6, wherein said circuit further includes a multiplexor connected to said address decoders, said method further comprising a step of disconnecting said address receivers from said word lines during said test mode using said multiplexor.

* * * * *